(12) United States Patent
Koo et al.

(10) Patent No.: US 8,624,243 B2
(45) Date of Patent: Jan. 7, 2014

(54) DISPLAY PANEL

(71) Applicant: Samsung Display Co., Ltd., Yongin (KR)

(72) Inventors: Bon-Yong Koo, Asan-si (KR); Kyung-Wook Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/918,060

(22) Filed: Jun. 14, 2013

(65) Prior Publication Data

US 2013/0277674 A1 Oct. 24, 2013

Related U.S. Application Data

(63) Continuation of application No. 12/887,836, filed on Sep. 22, 2010, now abandoned.

(30) Foreign Application Priority Data

Oct. 27, 2009 (KR) .................. 10-2009-0102475

(51) Int. Cl.
*H01L 23/58* (2006.01)

(52) U.S. Cl.
USPC .................. 257/48; 257/E33.062; 349/40

(58) Field of Classification Search
USPC .................. 257/48, E33.062; 349/40, 43
See application file for complete search history.

(56) References Cited

U.S. PATENT DOCUMENTS

| | | | |
|---|---|---|---|
| 6,882,378 B2 * | 4/2005 | Nagata et al. | 349/54 |
| 2002/0101547 A1 * | 8/2002 | Lee et al. | 349/40 |
| 2004/0005741 A1 | 1/2004 | Takenaka | |
| 2009/0213288 A1 * | 8/2009 | Chen et al. | 349/43 |
| 2010/0007369 A1 | 1/2010 | Kwak | |
| 2010/0238368 A1 | 9/2010 | Kim | |
| 2011/0254005 A1 | 10/2011 | Kim | |

FOREIGN PATENT DOCUMENTS

| | | |
|---|---|---|
| JP | 2007-226001 | 9/2007 |
| KR | 1020030030470 A | 4/2003 |
| KR | 1020060036655 A | 5/2006 |
| KR | 1020070072064 A | 7/2007 |
| KR | 102008008704 A | 1/2008 |
| KR | 1020080047790 A | 5/2008 |
| KR | 1020080048627 A | 6/2008 |
| KR | 1020080054180 A | 6/2008 |
| KR | 1020080061724 A | 7/2008 |
| KR | 1020080099411 A | 11/2008 |
| KR | 1020080102730 A | 11/2008 |

* cited by examiner

*Primary Examiner* — Phuc Dang

(74) *Attorney, Agent, or Firm* — Cantor Colburn LLP

(57) ABSTRACT

A display panel includes an insulation substrate having a display area and a peripheral area, wires disposed on the insulation substrate in the display area, first and second testing lines disposed on the insulation substrate and aligned substantially parallel to each other, and a diode unit disposed between the wires and one of the first testing line and the second testing line. The wires extend from the display area into the peripheral area and through diodes included in the diode unit, and the wires are electrically connected to the one of the first testing line and the second testing line.

12 Claims, 11 Drawing Sheets

DISPLAY PANEL

This application is a continuation of U.S. patent application Ser. No. 12/887,836, filed on Sep. 22, 2010 ABN, which claims priority to Korean Patent Application No. 10-2009-0102475, filed on Oct. 27, 2009, and all the benefits accruing therefrom under 35 U.S.C. §119, the content of which in its entirety is herein incorporated by reference.

BACKGROUND OF THE INVENTION (1) Field of the Invention

The present invention relates to a display panel and, more particularly, the present invention relates to a display panel that executes an array test.

(2) Description of the Related Art

Liquid crystal displays ("LCDs") are a type of flat panel display that is frequently used as a display device. A liquid crystal display typically includes two display panels on which field generating electrodes, such as pixel electrodes and a common electrode, are disposed, and a liquid crystal layer interposed between the two display panels. The liquid crystal display applies voltages to the field generating electrodes to generate an electric field in the liquid crystal layer. As a result, the alignment of liquid crystal molecules of the liquid crystal layer, and thus the polarization of light incident to the liquid crystal layer, is controlled to display an image on the liquid crystal display.

After manufacturing the liquid crystal display, an array test is performed to determine whether pixels in the liquid crystal display operate normally or if there is a defect, such as a disconnection. After the array test, test lines used for the array test are electrically separated from signal lines of the liquid crystal display.

However, the separated test lines are exposed outside the liquid crystal display, and the separated test lines are thereby often damaged, such as from corrosion due to heat or moisture from outside the liquid crystal display, for example. Moreover, this damage can be transmitted to the signal lines of the liquid crystal display.

BRIEF SUMMARY OF THE INVENTION

The present invention provides a display panel in which damage from test lines that are corroded by heat or moisture is effectively prevented from being transmitted to the display panel.

A display panel according to an exemplary embodiment of the present invention includes an insulation substrate having a display area and a peripheral area, wires disposed on the insulation substrate in the display area, first and second testing lines disposed on the insulation substrate and aligned substantially parallel to each other, and a diode unit disposed between the wires and the first testing line or the second testing line. The wires extend from the display area into the peripheral area and through diodes included in the diode unit, and the wires are electrically connected to the first testing line or the second testing line.

An input terminal and an output terminal of each of the diodes are formed with different wiring layers on the insulation substrate.

The diodes may be diode connected thin film transistors.

The thin film transistors may include a gate electrode formed with a same layer as a gate line, as well as a source electrode and a drain electrode formed with a same layer as a data line.

A gate insulating layer and a semiconductor layer may be disposed between the gate electrode and the drain electrode of each of the thin film transistors.

A portion of the semiconductor layer may be disposed under the drain electrode to have a same boundary as a boundary of the drain electrode on the insulation substrate.

An ohmic contact layer may be disposed between the semiconductor layer and the drain electrode on the insulation substrate.

A cutting line may be disposed between the first testing line or the second testing line and the diode to electrically disconnect the first testing line or the second testing line from the diodes of the diode unit.

The distance between the cutting line and the diodes may be about 200 micrometers (μm).

A shorting bar may be disposed substantially parallel to the one of the first testing line and the second testing line on the insulating substrate, wherein the shorting bar connects two or more of the wires to each other.

A static electricity protection circuit may be disposed on the insulating substrate between the diode unit and the wires to dissipate static electricity between the wires and the diode unit.

A pad may be disposed on the insulating substrate between the wires and the diode, and may supply a signal to the wires from an external source.

A pad may be on a side of the insulating substrate opposite to a side thereof on which the diode unit is disposed, wherein the pad supplies a signal to the wires from an external source.

The wires may be data lines or gate lines.

A display panel according to another exemplary embodiment of the present invention includes an insulation substrate including a display area and a peripheral area, wires disposed in the display area and a diode unit connected to portions of the wires which extend into the peripheral area from the display area. The wires pass through diodes in the diode unit and extend such that one end of the wires corresponds to an edge of the insulation substrate.

An input terminal and an output terminal of each of the diodes may be formed with different wiring layers on the insulation substrate.

The diodes may be a diode connected thin film transistors, and the thin film transistors may each include a gate electrode formed with a same layer as a gate line and a source electrode and a drain electrode formed with a same layer as a data line.

A gate insulating layer and a semiconductor layer may be disposed between the gate electrode and the drain electrode of each of the thin film transistors.

A portion of the semiconductor layer may be disposed under the drain electrode to have a same boundary as a boundary of the drain electrode on the insulation substrate.

A distance from a cutting line to the diodes may be about 200 μm.

The display panel may further include a pad which supplies a signal to the wires from an external source. The pad may be disposed between the diode and the wires or at a side of the insulating substrate opposite to a side thereof on which the diode unit is disposed.

According to the exemplary embodiments of the present invention as described herein, a diode is connected between a testing line and wires, and an insulating layer and semiconductor layer are disposed between the testing line and the wires, such that corrosion that results from the testing line being exposed and corroded by heat or moisture is not transmitted to the wires.

BRIEF DESCRIPTION OF THE DRAWINGS

The above and other aspects of the present invention will become more readily apparent by describing in further detail exemplary embodiments thereof with reference to the accompanying drawings, in which.

DETAILED DESCRIPTION OF THE INVENTION

Figure 1:
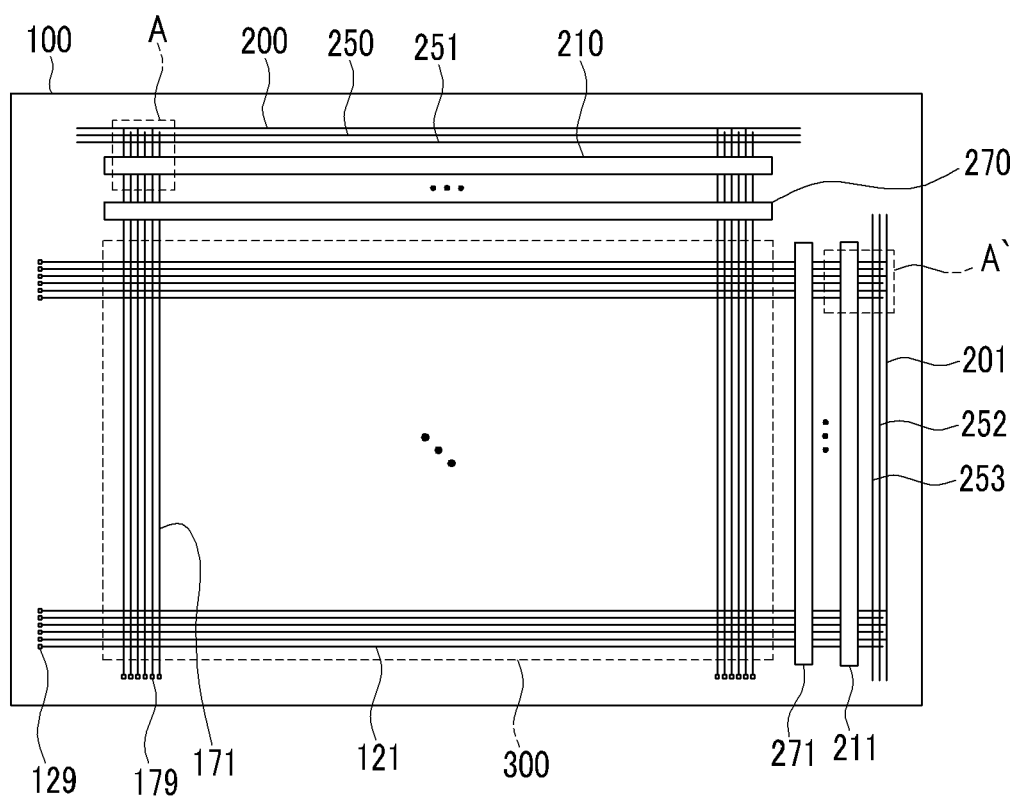
FIG. 1 is a plan view of an exemplary embodiment of a liquid crystal panel according to the present invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present invention will be described in further detail with reference to the accompanying drawings. It will be noted that, while exemplary embodiments described herein make particular reference to a liquid crystal panel as a representative example of a display panel, alternative exemplary embodiments are not limited thereto.

A liquid crystal panel according to an exemplary embodiment of the present invention will now be described in further detail with reference to FIG. 1.

FIG. 1 is a plan view of an exemplary embodiment of a liquid crystal panel according to the present invention and, more particularly, FIG. 1 illustrates a wiring arrangement of a lower substrate 100 of a liquid crystal panel according to one or more exemplary embodiments.

The lower substrate 100 includes a display area 300 and a peripheral area. In an exemplary embodiment, the peripheral area is disposed around, e.g., outside or surrounding, the display area 300, as shown in FIG. 1.

The display area 300 includes gate lines 121 and data lines 171 (hereinafter singly or collectively referred to as "wires"), as well as thin film transistors (not shown) connected thereto, and pixel electrodes (not shown) connected to output terminals of the thin film transistors.

On the lower substrate 100, the gate lines 121 and the data lines 171 intersect each other and are formed on, e.g., are disposed on, an insulation substrate 110 (FIG. 4) made of a material such as glass, for example, and a pixel including a switching element such as the thin film transistor (not shown) connected to the gate line 121 and the data line 171 disposed in the display area 300. In an exemplary embodiment, the gate lines 121 are disposed along a first, substantially longitudinal (as viewed in FIG. 1), direction, and the data lines 171 are disposed a second, substantially transverse direction, which is substantially perpendicular to the first direction. In an exemplary embodiment, the pixel of the display area 300 includes the pixel electrode connected to the output terminal of the thin film transistor.

In addition, the peripheral area includes pads 129 and 179, e.g., a gate pad 129 and a data pad 179, which receive signals from the outside, such as from an external source (not shown), for the wires (e.g., for the gate lines 121 and/or the data lines 171), testing lines 250, 251, 252 and 253 for applying test signals to the wires, and diode units 210 and 211 for transmitting the signals supplied from the testing lines 250, 251, 252 and 253 to the wires. The testing lines 250, 251, 252 and 253 and the diode units 210 and 211 include a first testing line 250 and a second testing line 251 and the first diode unit 210 connected to the data lines 171, and a third testing line 252 and a fourth testing line 253 and the second diode unit 211 connected to the gate lines 121.

According to an exemplary embodiment, the data pad 179 is disposed on an opposite side as a side to which the first diode unit 210 is closer and disposed in the peripheral area under the display area 300, and the gate pad 129 is disposed on the opposite side to the second diode unit 211 disposed in the peripheral area at the left side of the display area 300.

A first static electricity protection circuit unit 270 and a second static electricity protection circuit unit 271 protect the wires and the pixels from static electricity, e.g., by dissipating static electricity, and are disposed between the diode units 210 and 211 of the peripheral area and the wires. Shorting bars 200 and 201 connect a plurality of the wires, e.g., two or more of the wires, and are disposed outside of the diode units 210 and 211.

Put another way, the first static electricity protection circuit unit 270 is disposed between the first diode unit 210 and the gate lines 121, while the second static electricity protection circuit unit 271 is disposed between the second diode unit 211 and the data lines 171, as shown in FIG. 1, but alternative exemplary embodiments are not limited thereto.

One data line 171 passes through one static electricity protection circuit (not shown) included in the first static electricity protection circuit unit 270 and is connected to one diode, described in further detail below with reference to FIGS. 3-5, included in the first diode unit 210, and is electrically connected to one of the first and second testing lines 250 and 251, respectively. Also, the data line 171 may pass through the first and second testing lines 250 and 251 and be electrically connected to the first shorting bar 200.

On the other hand, one gate line 121 passes through one static electricity protection circuit (not shown) included in the second static electricity protection circuit unit 271 and is connected to one diode (FIGS. 5, 7 and 8) included in the second diode unit 211, and is electrically connected to the third and fourth testing lines 252 and 253, respectively. Also, the gate line 121 may pass through the third and fourth testing lines 252 and 253 and be electrically connected to the second shorting bar 201.

A structure of the wires disposed on the lower substrate will now be described in further detail with reference to FIGS. 1-8.

Figure 2:
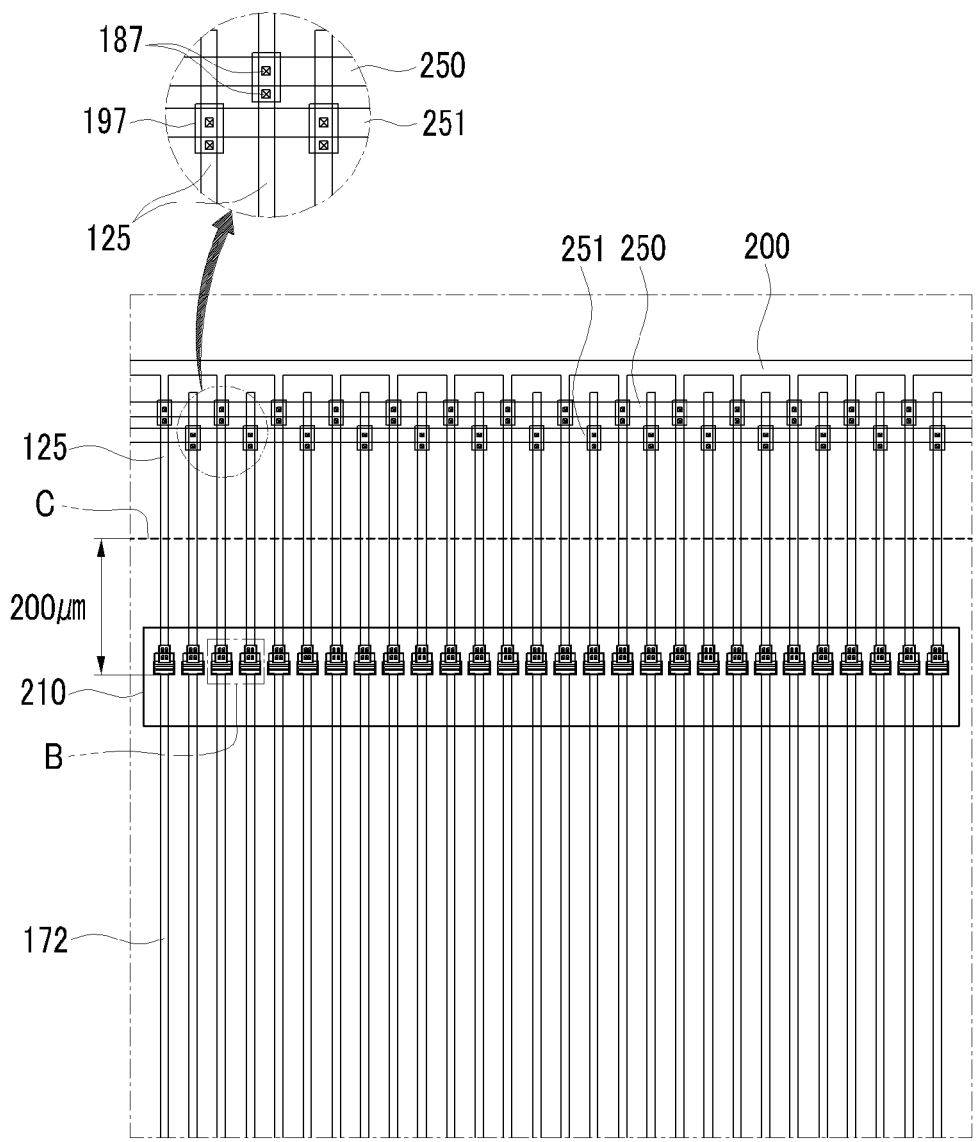
FIG. 2 is an enlarged view of region "A" of FIG. 1.
Figure 3:
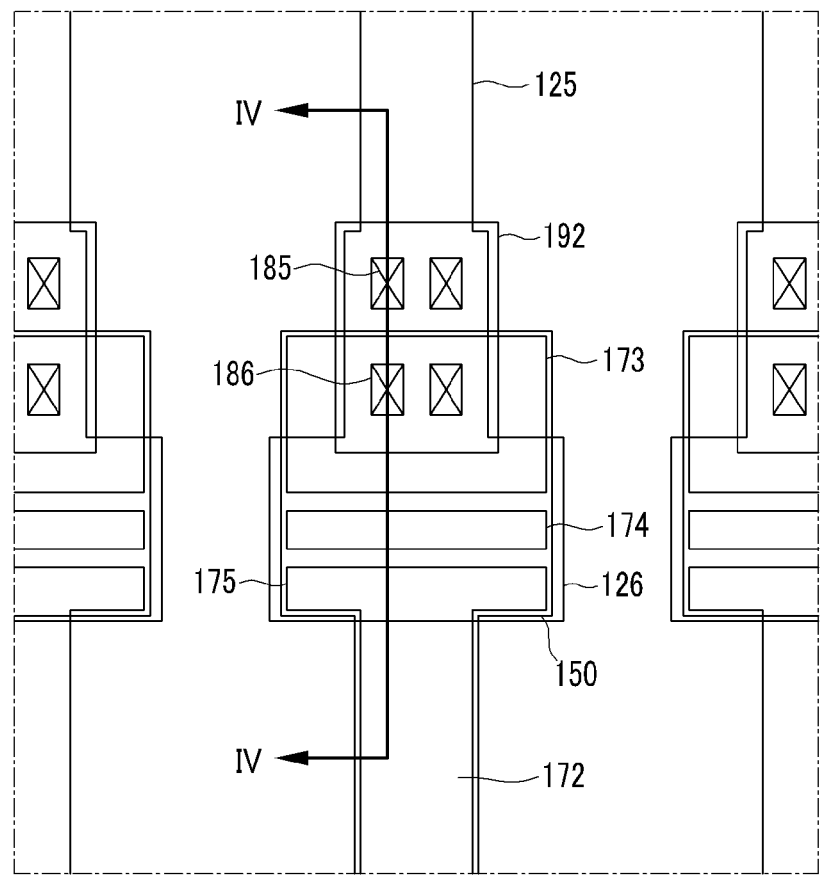
FIG. 3 is an enlarged view of region "B" of FIG. 2.
Figure 4:
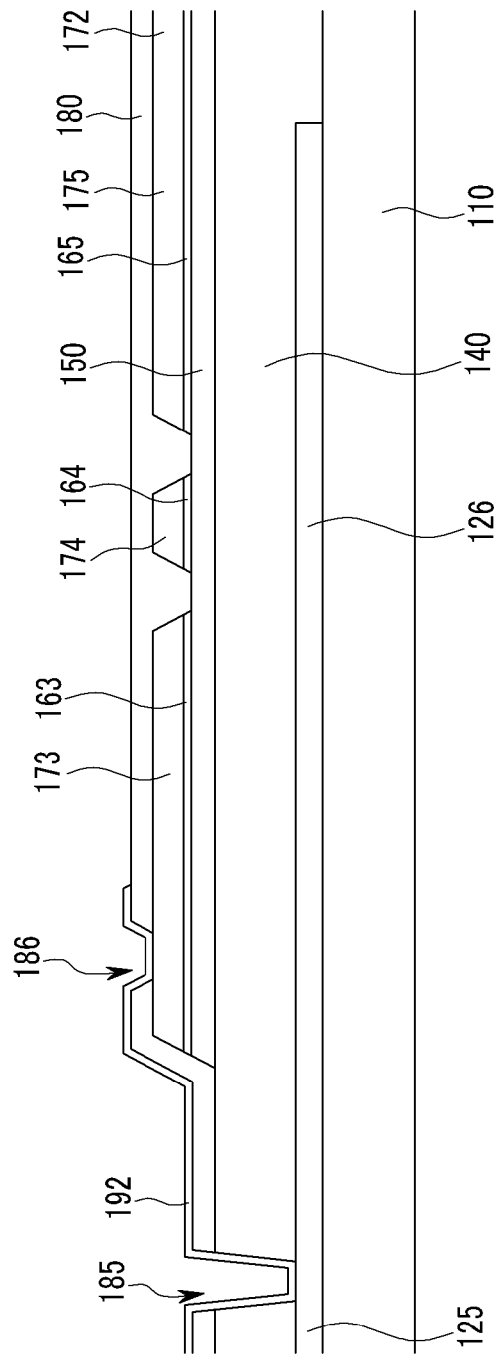
FIG. 4 is a cross-sectional view taken along line IV-IV of FIG. 3.
Figure 5:
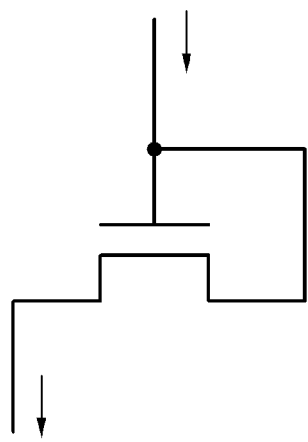
FIG. 5 is a schematic circuit diagram of a diode shown in FIGS. 2-4.
Figure 6:
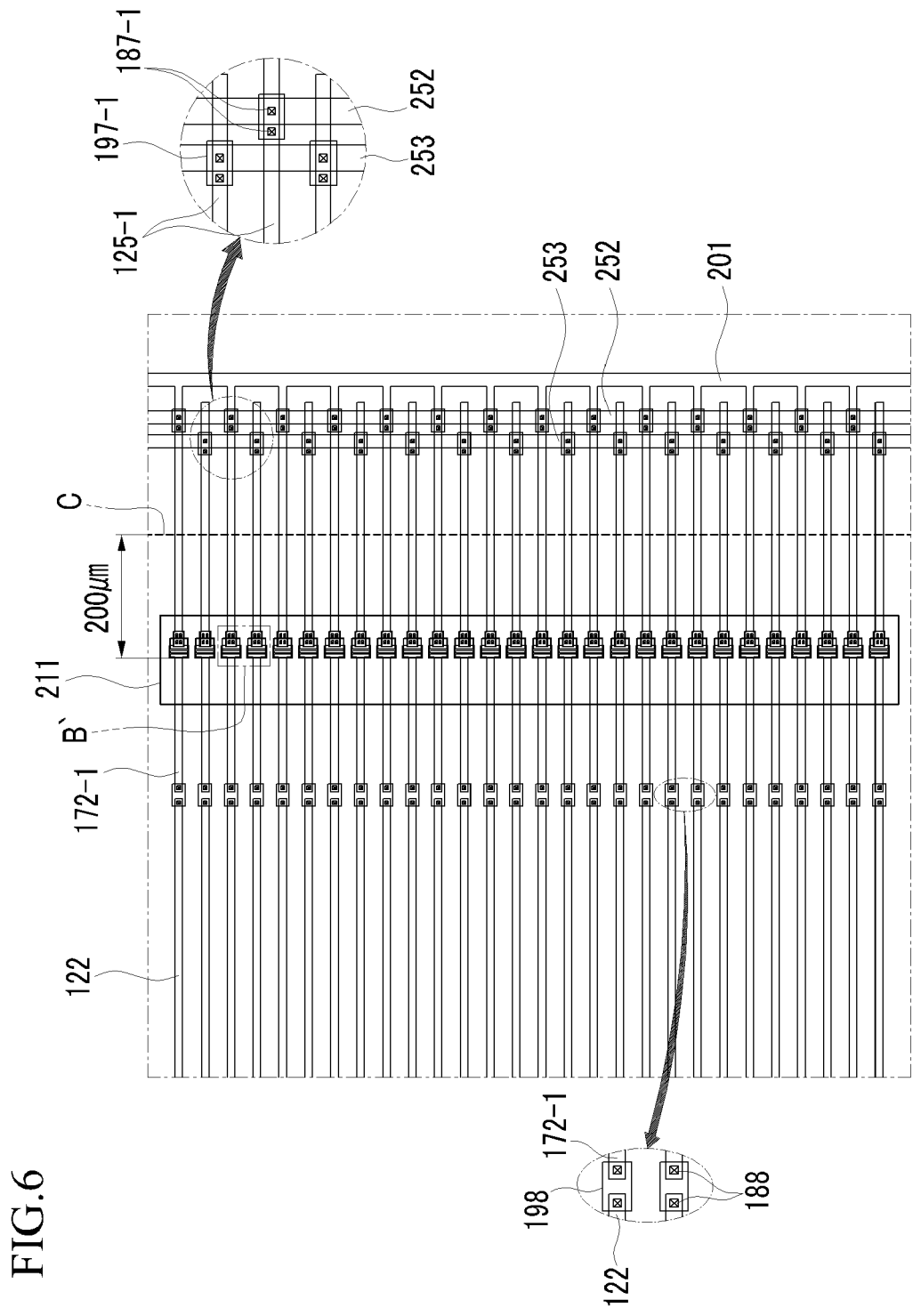
FIG. 6 is an enlarged view of region "A'" of FIG. 1.
Figure 7:
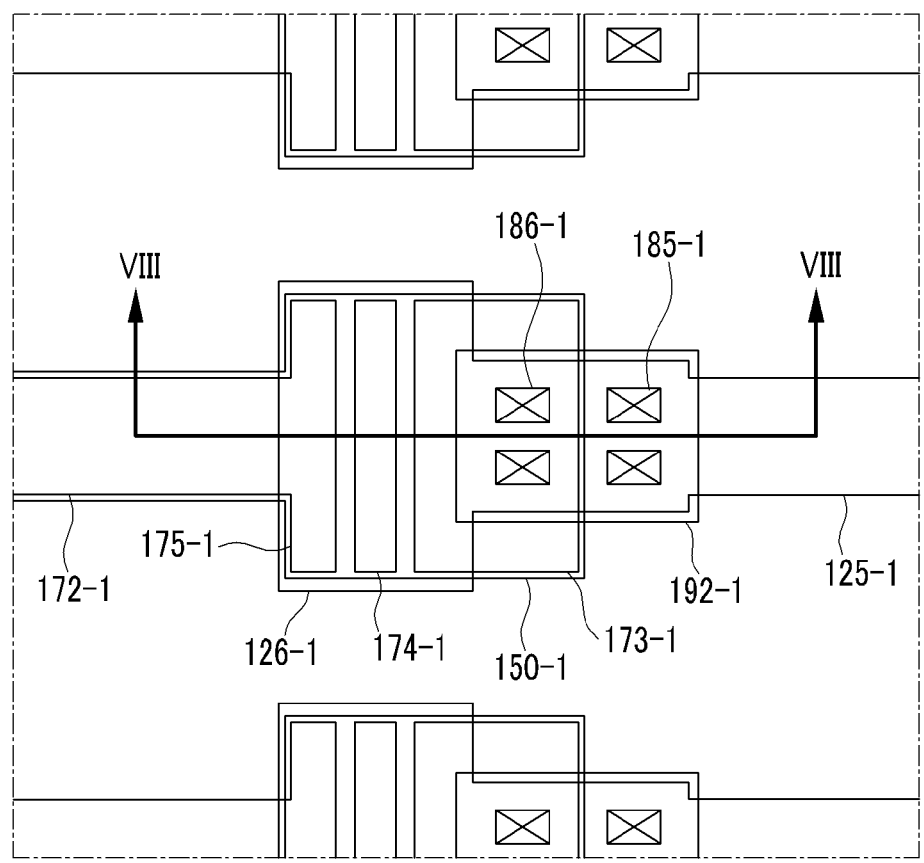
FIG. 7 is an enlarged view of region "B'" of FIG. 6.
Figure 8:
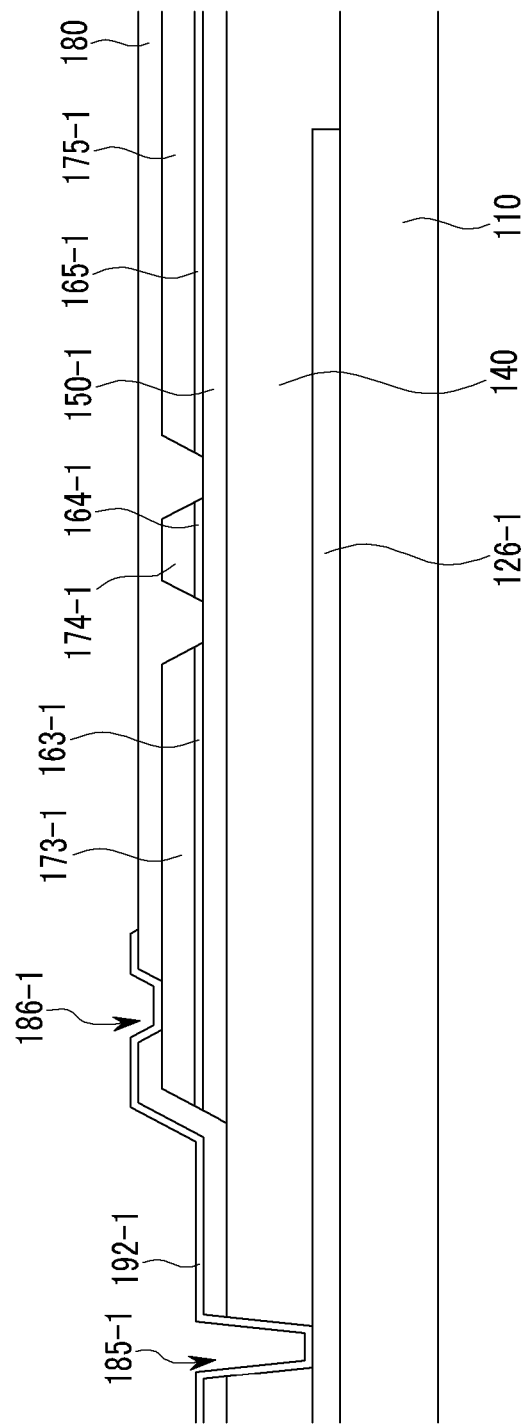
FIG. 8 is a cross-sectional view taken line VIII-VIII of FIG. 7.

FIG. 2 is an enlarged view of region "A" of FIG. 1, FIG. 3 is an enlarged view of region "B" of FIG. 2, FIG. 4 is a cross-sectional view taken along line IV-IV of FIG. 3, FIG. 5 is a schematic circuit diagram of a diode shown in FIGS. 2-4, FIG. 6 is an enlarged view of region "A'" of FIG. 1, FIG. 7 is an enlarged view of region "B'" of FIG. 6, and FIG. 8 is a cross-sectional view taken line VIII-VIII of FIG. 7.

A structure of the first diode unit 210, the first and second testing lines 250 and 251, and the first shorting bar 200 connected to the data line 171 will now be described in further detail with specific reference to FIGS. 2-5.

In an exemplary embodiment of the present invention, the data pad 179, disposed at one end of the data line 171, is positioned at a lower peripheral area of the lower substrate 100.

The first static electricity protection circuit unit 270, the first diode unit 210, the first and second testing lines 250 and 251, and the first shorting bar 200 are disposed at the other end of the data line 171.

Referring to FIGS. 1 and 2, the data lines 171 are connected to the first static electricity protection circuit unit 270, and each data line 171 is electrically connected to one end of one static electricity protection circuit (not shown) in the first static electricity protection circuit unit 270. The other end of the static electricity protection circuit is connected to the first diode unit 210 through a connection line 172 aligned substantially parallel to the data line 171. Each connection line 172 is connected to one end of each diode (FIGS. 3 and 4) in the first diode unit 210. The other end of the diode is electrically connected to one of the first and second testing lines 250 and 251, respectively, through another connection line 125, which is also disposed substantially parallel to the data line 171. As shown in FIG. 2, in one or more exemplary embodiments, at least one of the first and second testing lines 250 and 251 and the connection line 125 are connected to each other. Additionally, the connection line 125, disposed along the transverse direction (as viewed in FIG. 1), and the first and second testing lines 250 and 251, disposed along the longitudinal direction thereby, form an intersecting point, and a connecting member 197, which may be made of the same material as the pixel electrode (not shown), is disposed on the intersecting point, thereby electrically connecting the lines to each other. Thus, a contact hole 187, which exposes the testing lines, is disposed in a region where the connecting member 197 and one of the testing lines 250 and 251 overlap with each other, and another contact hole 187, which exposes the connection line 125, is disposed in a region where the connecting member 197 and the connection line 125 overlap each other, such that the testing lines and the connection line 125 are electrically connected to each other through the connecting member 197, as shown in FIG. 2. In an exemplary embodiment, the first and second testing lines 250 and 251 may be formed of the same material as is the data line 171.

A portion of the connection line 125 is further extended and may be connected to the first shorting bar 200 and, more particularly, the connection line 125 extended from only even-numbered (or, alternatively, odd-numbered) data lines 171 is connected to the first shorting bar 200, but alternative exemplary embodiments are not limited thereto. The connection line 125, connected to the first shorting bar 200, may be formed together with the same material as the shorting bar 200, which, in an exemplary embodiment is the same material as the gate line 121.

The structure of each diode will now be described in further detail with reference to FIGS. 3 through 5.

In an exemplary embodiment, each diode is a diode connected thin film transistor ("TFT"), in which a control terminal and a input terminal of the TFT, which is a three terminal switching element, are connected to each other, as shown in the schematic circuit diagram of the diode connected TFT shown in FIG. 5. In an exemplary embodiment, the diode connected TFT (hereinafter referred to as the "transistor") is formed as shown in FIG. 3 and FIG. 4, as will now be described in further detail.

The connection line 125, connected to one of the first and second testing lines 250 and 251 and substantially parallel to the data line 171 is extended to have a wide width (relative to other portions thereof), thereby forming a gate electrode 126. The connection line 125 and the gate electrode 126 are disposed on an insulating substrate 110, e.g., the insulation substrate 110 described above. In an exemplary embodiment, the gate electrode 126 forms a control terminal of the transistor, and the connection line 125 and the gate electrode 126 are formed with the same material as the gate line 121 of the display area 300.

A gate insulating layer 140 is disposed on the connection line 125 and the gate electrode 126. The gate insulating layer 140 covers almost all of the region of the lower substrate 100, including the display area 300, and may include a contact hole 185 for exposing a portion of the gate pad 129 and the connection line 125.

A semiconductor layer 150 is disposed on the gate insulating layer 140. The semiconductor layer 150 covers at least a portion of the upper portion of the gate electrode 126, and includes a channel region. In an exemplary embodiment, the semiconductor layer 150 is formed with the same material as a semiconductor layer (not shown) of the display area 300.

A source electrode 173 and a drain electrode 175, which in an exemplary embodiment are the input terminal and the output terminal, respectively, of the transistor, are disposed on the semiconductor layer 150. The source electrode 173 is electrically connected to the connection line 125, and receives an input signal from the connection line 125. The drain electrode 175 is extended, thereby having a same function as the connection line 172, connecting the diode and the first static electricity protection circuit unit 270. A floating electrode 174 is disposed between the drain electrode 175 and the source electrode 173. In an exemplary embodiment, the floating electrode 174 has a function of ensuring the channel region of the semiconductor layer 150. Ohmic contact layers 163, 164 and 165 are respectively disposed between the semiconductor layer 150 and the source electrode 173, the semiconductor layer 150 and the floating electrode 174, and the semiconductor layer 150 and the drain electrode 175, as shown in FIG. 4. The source electrode 173, the drain electrode 175 and the floating electrode 174 may be formed together with the same material as the data line 171 of the display area 300. Also, in an exemplary embodiment, the semiconductor layer 150 may be etched such that the ohmic contact layers 163, 164 and 165, which are etched with the source electrode 173, the floating electrode 174 and the drain electrode 175, respectively, have common, e.g., the same, boundaries with the semiconductor layer 150.

A passivation layer 180 is disposed on the gate insulating layer 140, the source electrode 173, the drain electrode 175 and the floating electrode 174. The passivation layer 180 has a contact hole 186 for exposing a portion of the source electrode 173 and a contact hole 185 for exposing a portion of the connection line 125. In an exemplary embodiment, the passivation layer 180 covers all the diodes.

A connecting electrode 192 for connecting the connection line 125 and the source electrode 173 is disposed on the passivation layer 180.

Thus, in an exemplary embodiment, the diodes of the first diode unit 210 are formed as diode connected transistors (FIG. 5). When forming the diode, a width of the channel of the diode is sufficiently to effectively prevent problems when applying an array test signal.

In an exemplary embodiment, the array test for checking for problems such as a disconnection of the data line 171 is performed using the above-described structure of the exemplary embodiments shown in FIGS. 1-5. The array test may be executed in a state in which the upper substrate (not shown) and the liquid crystal layer (not shown) are formed. For the array test, the first and second testing lines 250 and 251 are supplied with different voltages. Specifically, for example, one testing line is supplied with a high voltage and the other testing line is supplied with a (relatively) low voltage, and opposite voltages may be applied after a predetermined period. As a result, any defects of a corresponding pixel may be confirmed by observing display deterioration in the pixels.

The connection line 125 is disconnected with respect to a line C (e.g., a cutting line C) of shown in FIG. 2, or the upper portion of the line C (the cutting line C) of the lower substrate 100 may be cut, as will be described in further detail below with reference to FIGS. 9 and 10. Also, the first diode unit 210 is positioned at a distance from the line C (the cutting line C), which, in an exemplary embodiment, is a distance of about 200 micrometers (μm), as shown in FIG. 2. It will be noted that, in additional exemplary embodiments, the distance may be changed and, this distances of more or less than 200 μm are possible.

When the connection line 125 is disconnected or cut such that it is exposed to the outside, the connection line may be corroded by heat and/or moisture. This corrosion is extended, and then may adversely affect the display area 300. In an exemplary embodiment, however, the diode, as shown in FIG. 3 and FIG. 4, is disposed between the display area 300 and the line C (cutting line), such that any corrosion does not spread into the display area 300. Specifically, for the corrosion to progress into the display area 300, the corrosion must pass through the gate insulating layer 140 and the semiconductor layer 150 after it progresses to the end of the connection line 125, and then must progress to the connection line 172 through the drain electrode 175. However, in an exemplary embodiment, the gate insulating layer 140 and the semiconductor layer 150 block the corrosion such that it does not progress further, e.g., such that it does not progress into the display area 300. Therefore, in an exemplary embodiment, the gate insulating layer 140 and the semiconductor layer 150 are a double blocking film. As a result, the corrosion does not progress into the drain electrode 175, and the display area 300 remains free of corrosion. Also, as shown in FIG. 2, the distance between the line C (the cutting line C) and the first diode unit 210 in an exemplary embodiment is about 200 μm, and it therefore takes a sufficiently long time for the corrosion to progress this distance, such that the corrosion progression is further prevented. However, although the distance between the line C (cutting line) and the first diode unit 210 may also be small, the diode in the first diode unit 210 includes the double blocking film of the gate insulating layer 140 and the semiconductor layer 150 such that the corrosion still does not progress into the display area 300.

In FIG. 5, the diode of FIG. 3 and FIG. 4 is represented in a schematic circuit diagram. As shown in FIG. 5, the array test signal input into the control terminal of the transistor is transmitted through the output terminal, and the width of the channel of the transistor is controlled to remove the problem of the transmission of the array test signal.

The structure of the second diode unit 211, the third and fourth testing lines 252 and 253, and the second shorting bar 201 connected to the gate line 121 of FIG. 1 will now be described in further with reference to FIGS. 6 through 8.

In an exemplary embodiment, the gate pad 129 at one end of the gate line 121 is positioned in the left peripheral area of the lower substrate 100. On the other hand, the second static electricity protection circuit unit 271, the second diode unit 211, the third and fourth testing lines 252 and 253, and the second shorting bar 201 are disposed at the other end of the gate line 121.

Referring to FIG. 1 and FIG. 6, the gate line 121 is connected to the second static electricity protection circuit unit 271, and each gate line 121 is electrically connected to one end of one static electricity protection circuit (not shown) in the second static electricity protection circuit unit 271. The other end of the static electricity protection circuit is connected to the second diode unit 211 through connection lines 122 and 172-1 that are aligned substantially parallel to the gate line 121. Each of the connection lines 122 and 172-1 is connected to one end of the diode (FIG. 7 and FIG. 8) in the second diode unit 211. In an exemplary embodiment, the connection lines 122 and 172-1 may be formed by connecting two lines that are separated from each other, as shown in FIG. 6, which illustrates an enlarged connection relationship thereof. The connection lines 122 and 172-1 extend substantially parallel to the gate line 121, the connection line 122 near the display area 300 is directly connected to the gate line 121 and is made of the same material as the gate line 121, and the other connection line 172-1 is substantially parallel to the gate line 121, but it is made, however, of the same material as the data line 171. As shown in FIG. 6, the ends of the two connection lines 122 and 172-1 are opposite to each other, and are electrically connected to each other through a connecting member 198 covering a portion thereof. In addition, a contact hole 188 for exposing the connection line 122 is formed in a region where the connection line 122 is directly connected to the gate line 121 and the connecting member 198 overlap each other, and a contact hole 188 for exposing the other connection line 172-1 is formed in the region where the other connection line 172-1 and the connecting member 198 overlap each other, thereby connecting these components to the connecting member 198. In an exemplary embodiment, the connecting member 198 is disposed on two connection lines 122 and 172-1, and may be formed together of the same material as the pixel electrode (not shown).

The other end of each of the diodes is electrically connected to one of the third and fourth testing lines 252 and 253, respectively, through another connection line 125-1 aligned substantially parallel to the gate line 121. FIG. 6 shows an enlarged structure in which one of the third and fourth testing lines 252 and 253 and the connection line 125-1 are connected to each other. As shown in FIG. 6, the connection line 125-1 is disposed along the longitudinal direction, and the third and fourth testing lines 252 and 253 are disposed along the transverse direction and, accordingly, the intersecting point is formed, and a connecting member 197-1 made of the same material as the pixel electrode (not shown) is disposed on the intersecting point thereby electrically connecting the two lines. Thus, a contact hole 187-1 for exposing the testing line is disposed in the region where the connecting member 197-1 and one of the testing lines 252 and 253 overlap each other, and a contact hole 187-1 for exposing the connection line 125-1 is disposed in the region where the connecting member 197-1 and the connection line 125-1 overlap such that the two lines are electrically connected to each other through the connecting member 197-1. In an exemplary embodiment, the third and fourth testing lines 252 and 253 may be formed with the same material as the data line 171.

A portion of the connection line 125-1 further extends such that it may be connected to the second shorting bar 201, and the connection line 125-1 extended only from the even-numbered or, alternatively, the odd-numbered gate lines 121 is connected to the second shorting bar 201, but alternative exemplary embodiments are not limited thereto. The connection line 125-1, which is connected to the second shorting bar 201, may be formed together with the same material as the shorting bar 201 and, in an exemplary embodiment, with the same material as the gate line 121.

The structure of each diode will now be described in further detail with reference to FIG. 7 and FIG. 8.

Each diode according to an exemplary embodiment has a diode connected TFT structure in which the control terminal and the input terminal of the TFT, e.g., the transistor, which is a three terminal element, are connected to each other, as shown in the schematic circuit diagram of FIG. 5. In an exemplary embodiment, the diode connected transistor is formed as shown in FIG. 7 and FIG. 8.

More particularly, the connection line 125-1 connected to one of the third and fourth testing lines 252 and 253, respectively, and aligned substantially parallel to the gate line 121 is extended to have a wide width, relative to other portions thereof, thereby forming a gate electrode 126-1. In an exemplary embodiment, the gate electrode 126-1 forms the control terminal of the transistor, and the connection line 125-1 and the gate electrode 126-1 are formed with the same material as the gate line 121 of the display area 300.

The gate insulating layer 140 is disposed on the connection line 125-1 and the gate electrode 126-1. The gate insulating layer 140 covers almost all of the region of the lower substrate 100 including the display area 300, and may include a contact hole 185-1 for exposing a portion of the gate pad 129 and the connection line 125-1.

A semiconductor layer 150-1 is disposed on the gate insulating layer 140. The semiconductor layer 150-1 covers at least a portion of the upper portion of the gate electrode 126-1, and includes a channel region. The semiconductor layer 150-1 is formed with the same material as the semiconductor layer of the display area 300.

A source electrode 173-1 and a drain electrode 175-1, which are the input terminal and the output terminal, respectively, of the transistor, are disposed on the semiconductor layer 150-1. The source electrode 173-1 is electrically connected to the connection line 125-1, and receives the input signal from the connection line 125-1. The drain electrode 175-1 is extended thereby having a same function as the connection line 172-1 connecting the diode and the first static electricity protection circuit unit 270. A floating electrode 174-1 is disposed between the drain electrode 175-1 and the source electrode 173-1, and the floating electrode 174-1 ensures the channel region of the semiconductor layer 150-1. In an exemplary embodiment, ohmic contact layers 163-1, 164-1 and 165-1 are respectively disposed between the semiconductor layer 150-1 and the source electrode 173-1, the semiconductor layer 150-1 and the floating electrode 174-1, and the semiconductor layer 150-1 and the drain electrode 175-1. The source electrode 173-1, the floating electrode 174-1 and the drain electrode 175-1 are formed together with the same material as the data line 171 of the display area 300. Also, the semiconductor layer 150-1 and the ohmic contact layers 163-1, 164-1 and 165-1 are etched, along with the source electrode 173-1, the floating electrode 174-1 and the drain electrode 175-1, respectively, such that they may have the same boundary except for the channel portion.

The passivation layer 180 is disposed on the gate insulating layer 140, the source electrode 173-1, the drain electrode 175-1 and the floating electrode 174-1. The passivation layer 180 has a contact hole 186-1 for exposing the portion of the source electrode 173 and a contact hole 185-1 for exposing a portion of the connection line 125, and covers all the diodes.

A connecting electrode 192-1 for connecting the connection line 125-1 and the source electrode 173-1 is disposed on the passivation layer 180.

Thus, in an exemplary embodiment, the diodes of the second diode unit 211 are formed to be the diode connected transistors. When forming the diodes, a width of the channel of the diodes is sufficiently to effectively prevent problems when applying the array test signal.

The array test for checking for problems, such as disconnection of the gate line 121, is performed using the exemplary embodiments as described above with reference to structure of FIG. 1 and FIGS. 6-8. The array test may be performed in a state in which the upper substrate (not shown) and the liquid crystal layer (not shown) are formed. For the array test, the third and fourth testing lines 252 and 253, respectively, are supplied with different voltages. Specifically, for example, one testing line is supplied with a high voltage and the other testing line is supplied with a (relatively) low voltage, and opposite voltages may be applied after a predetermined period. As a result, any defects of a corresponding pixel may be confirmed by observing display deterioration in the pixels.

In an exemplary embodiment, the connection line 125-1 is disconnected at a line C (e.g., a cutting line C) shown in FIG. 6, or, alternatively, a right portion of the line C (the cutting line C) of the lower substrate 100 may be cut and/or removed, as will be described in further detail below with reference to FIG. 9 and FIG. 10. Also, the second diode unit 211 is positioned at a distance from the line C (the cutting line C), such as at a distance of about 200 µm, as illustrated in FIG. 6. It will be noted that, in alternative exemplary embodiments, this distance may be changed, and distances of more than or less than 200 µm are possible.

Accordingly, when the connection line 125-1 is disconnected or cut such that it is exposed to the outside, the connection line may be corroded by heat and/or moisture. This corrosion extends toward, and then may influence, the display area 300. In an exemplary embodiment, however, the diode (FIG. 7 and FIG. 8) is disposed between the display area 300 and the line C (the cutting line C) such that the corrosion does not spread into the display area 300. Specifically, for the corrosion to progress into the display area 300, the corrosion must pass through the gate insulating layer 140 and the semiconductor layer 150 after it progresses to the end of the connection line 125, and then must progress to the connection lines 172-1 and 122 through the drain electrode 175-1. However, in an exemplary embodiment, the gate insulating layer 140 and the semiconductor layer 150-1 blocking the corrosion (as they are a double blocking film) such that the corrosion does not progress further. As a result, the corrosion does not progress into the drain electrode 175, and the display area 300 is thereby maintained to be free of corrosion. Also, as shown in FIG. 6, the distance between the line C (the cutting line C) and the second diode unit 211 is about 200 µm, and thus it takes a (relatively) long time for the corrosion to progress along this distance from the line C (the cutting line C) to the connection line 125 and, accordingly, the transition of the corrosion is further prevented. However, although the distance between the line C (the cutting line C) and the second diode unit 211 may be reduced, the diode in the second diode unit 211 includes the double blocking film (e.g., the gate insulating layer 140 and the semiconductor layer 150-1) such that the corrosion still does not progress into the display area 300.

As shown in FIG. 5, the diode of FIG. 7 and FIG. 8 (as well as the diode of FIG. 3 and FIG. 4) is represented in a schematic circuit diagram. As shown in FIG. 5, the array test signal input into the control terminal of the transistor is transmitted through the output terminal, and the width of the channel of the transistor may be controlled to remove the problem of the transmission of the array test signal.

Instances in which the connection lines 125 and 125-1 are disconnected with respect to the line C (the cutting line C), and the portion outside the cutting line C of the lower substrate 100 are cut and removed, will now be described in further detail.

In the exemplary embodiment shown in FIG. 1, the signal is applied to the gate lines 121 and the data lines 171 to perform the array test. However, the pixels independently display the image during the test; therefore, it is necessary to separate the gate lines 121 and the data lines 171 by cutting at with the cutting line C. This separating method is basically categorized into two types, shown in FIG. 9 and FIG. 10.

Figure 9:
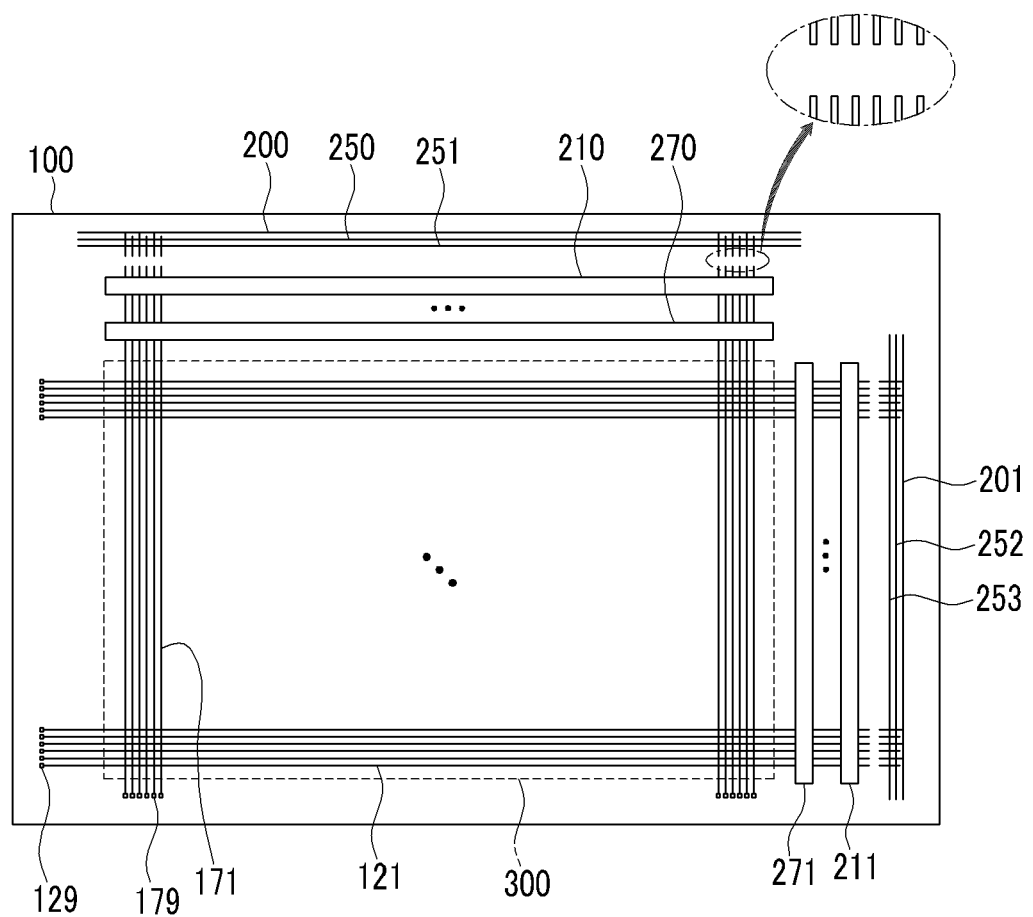
FIG. 9 and FIG. 10 are plan views showing exemplary embodiments of a liquid crystal panel, after disconnecting a connection line, according to the present invention.
Figure 10:
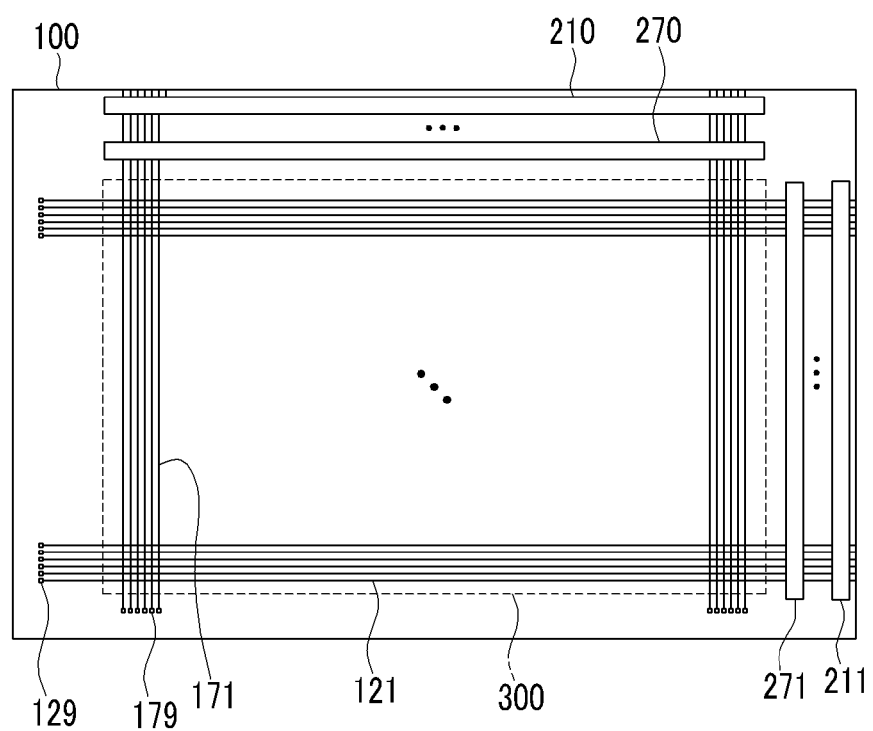

FIG. 9 and FIG. 10 are plan views showing exemplary embodiments of a liquid crystal panel after disconnecting a connection line.

FIG. 9 shows an exemplary embodiment of only disconnecting the connection lines 125 and 125-1 by using a laser, for example. As a result, the connection lines 125 and 125-1 are disconnected such that the gate lines 121 and the data lines 171 are separated from each other, thereby allowing the display device to operate normally, e.g., in a non-test type mode. As shown in FIG. 9, the testing lines 250, 251, 252 and 253 and the shorting bars 200 and 201 remain on the lower substrate 100.

On the other hand, FIG. 10 shows an exemplary embodiment of removing the lower substrate 100 and the wires disposed thereon by cutting the substrate with respect to a position of the cutting line C. In an exemplary embodiment, the testing lines and the shorting bars on the lower substrate 100 are removed, such that the unnecessary wires are removed from the lower substrate 100; however it is more difficult to cut the substrate than cutting the wires by using the laser (as shown in FIG. 9).

Thus, the exemplary embodiments of the methods shown in FIG. 9 and FIG. 10 each have their own merits and drawbacks, and accordingly, either one of the two methods may be selected.

Another exemplary embodiment of the present invention will now be described in further detail with reference to FIG. 11, which is a plan view of another exemplary embodiment of a liquid crystal panel according to the present invention.

The same or like components in FIG. 11 correspond to those in FIG. 1, and the same reference characters are therefore used in both FIGS. 1 and 11, and any repetitive detailed description thereof will hereinafter be omitted or simplified. It will be noted that, as shown in FIG. 11, the pads 129 and 179 are disposed in the peripheral area near the diode units 210 and 211, which is different from the exemplary embodiment shown in FIG. 1.

Figure 11:
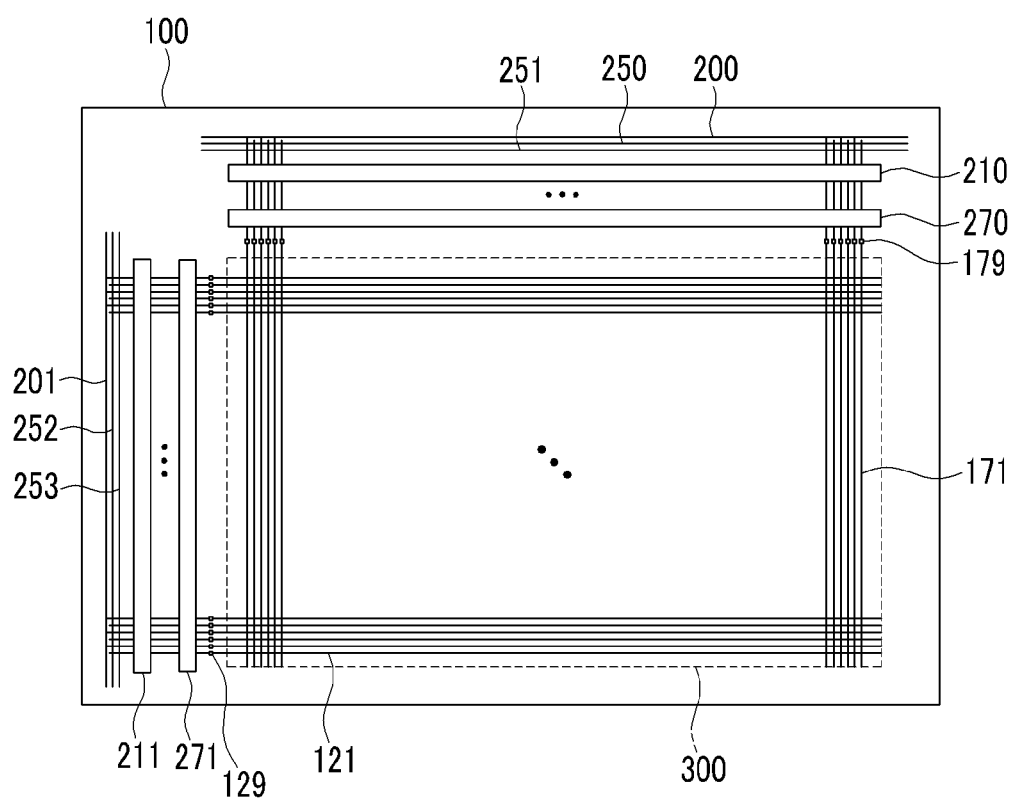
FIG. 11 is a plan view of another exemplary embodiment of a liquid crystal panel according to the present invention.

Referring now to FIG. 11, the peripheral area includes the pads 129 and 179 for receiving signals from the outside, e.g., from an external source (not shown), for the wires, testing lines 250, 251, 252 and 253 for applying the test signals to the wires, and diode units 210 and 211 for transmitting the signals supplied from the testing lines to the wires. The testing lines 250, 251, 252 and 253 and the diode units 210 and 211 include the first and second testing lines 250 and 251 and the first diode unit 210, which are connected to the side of the data line 171, and the third and fourth testing lines 252 and 253 and the second diode unit 211, which are connected to the side of the gate line 121.

According to an exemplary embodiment as shown in FIG. 11, the data pad 179 and the first diode unit 210 are disposed on the same side (with respect to the data line 171) thereby being disposed in the peripheral area on the display area 300, and the gate pad 129 and the second diode unit 211 are disposed on the same side (with respect to the gate line 121) thereby being disposed in the peripheral area at the left side of the display area 300.

Static electricity protection circuit units 270 and 271 to protect the wires and the pixel from static electricity are disposed between the diode units 210 and 211 of the peripheral area and the pads 179 and 129, and shorting bars 200 and 201 for connecting a plurality of the wires are disposed outside the diode units 210 and 211.

Thus, the first static electricity protection circuit unit 270 is disposed between the first diode unit 210 and the data pad 179, and the second static electricity protection circuit unit 271 is disposed between the second diode unit 211 and the gate pad 129.

One data line 171 that is extended from the data pad 179 passes through one static electricity protection circuit (not shown) included in the first static electricity protection circuit unit 270 and is connected to one diode (FIG. 3 and FIG. 4) included in the first diode unit 210, and is electrically connected to one of the first and second testing lines 250 and 251. Also, the data line 171 may pass through the testing lines 250 and 251 and be electrically connected to the first shorting bar 200.

One gate line 121 that is extended from the gate pad 129 passes through one static electricity protection circuit (not shown) included in the second static electricity protection circuit unit 271 and is connected to one diode (FIG. 7 and FIG. 8) included in the second diode unit 211, and is electrically connected to the third and fourth testing lines 252 and 253. Also, the gate line 121 may pass through the testing lines 252 and 253 and be electrically connected to the second shorting bar 201.

Thus, the exemplary embodiment of FIG. 11 is substantially the same as the exemplary embodiment of FIG. 1, except for the position of the pads 129 and 179.

In both of the exemplary embodiments of FIG. 1 and FIG. 11, the static electricity protection circuit unit is described. However, as described above, the static electricity protection circuit unit may be disposed only on the side of the gate line or the side of the data line, although additional exemplary embodiments are not limited thereto. Also, in FIG. 1 and FIG. 11, the static electricity protection circuit unit is positioned between the wires (or the pads) and the diode unit; however it may be disposed on the opposite side of the diode unit with respect to the wires.

The pads 129 and 179 of FIG. 1 and FIG. 11 are electrically connected to a gate driver (not shown) and a data driver (not shown) to receive gate signals and data voltages, respectively. In an exemplary embodiment, the gate driver may be formed to include a plurality of thin film transistors and be formed along with a forming of the display area 300. In this case, the gate pad 129 is not included, and the gate line may instead be directly connected to the gate driver. In additional exemplary embodiments, the shorting bar 201, the testing lines 252 and 253, and the second diode unit 211 may be omitted from the side of the gate line.

The pads 129 and 179 of FIG. 1 and FIG. 11 are arranged along one direction, however they may be arranged in alternative manners, e.g., in a zigzag shape, but not being limited thereto. Specifically, for example, in an exemplary embodiment the gate pads 129 are arranged in one line substantially parallel to the data line 171 (as shown in FIG. 1 and FIG. 11). However according to additional exemplary embodiments, the gate pads connected to the even-numbered gate lines are further moved and disposed in the left side, and the gate pads connected to the odd-numbered gate lines are further moved and disposed in the right side thereby, forming the zigzag structure.

Also, as shown in FIG. 1 and FIG. 11, a number of the testing lines is uniform, however this may be changed in additional exemplary embodiments. For example, three wires may be used as the testing lines and may be formed substantially parallel to each other on one side of the peripheral area, or, alternatively, one wire may be disposed thereon.

In the exemplary embodiments shown in FIG. 1 and FIG. 11, the shorting bar is illustrated; however the shorting bar may be omitted in an alternative exemplary embodiment. Alternatively, two or more shorting bars may be formed on one side of the peripheral area, and the shorting bar for the gate line and the shorting bar for the data line may be electrically connected to each other.

While the present invention has been described herein with reference to exemplary embodiments thereof, it will be understood that the present invention should not be construed as being limited to the exemplary embodiments set forth herein. Rather, these exemplary embodiments are provided so that this disclosure will be thorough and complete and will fully convey the concept of the present invention to those skilled in the art.

Moreover, while the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A display panel comprising:
   an insulation substrate including a display area and a peripheral area;
   a wire disposed on the insulation substrate in the display area;
   a testing line disposed on the insulation substrate and disposed in the peripheral area;
   a diode unit electrically connected to the wire and disposed between the wire and the testing line;
   a static electricity protection circuit disposed between the diode unit and the wire, and electrically connected to the diode unit;
   a cutting line disposed between the testing line and the diode unit; and
   a connection line disposed between the testing line and the diode unit, and disconnected to the diode unit at the cutting line.

2. The display panel of claim 1, wherein
   the diode unit comprises a plurality of diodes, and an input terminal and an output terminal of each of the diodes are formed with different wiring layers on the insulation substrate.

3. The display panel of claim 2, wherein
   each of the diodes is a diode connected thin film transistor.

4. The display panel of claim 3, wherein the thin film transistor comprises:

a gate electrode formed with a same layer as a gate line on the insulation substrate;
a source electrode formed with a same layer as a data line on the insulation substrate; and
a drain electrode formed with the same layer as the data line on the insulation substrate.

5. The display panel of claim 4, wherein
a gate insulating layer and a semiconductor layer are disposed between the gate electrode and the drain electrode of the thin film transistor.

6. The display panel of claim 5, wherein
a portion of the semiconductor layer is disposed under the drain electrode to have a same boundary as a boundary of the drain electrode on the insulation substrate.

7. The display panel of claim 5, wherein
an ohmic contact layer is disposed between the semiconductor layer and the drain electrode.

8. The display panel of claim 4, wherein
the wire comprises the gate line or the data line.

9. The display panel of claim 1, wherein
a distance between the cutting line and the diodes is about 200 micrometers.

10. The display panel of claim 1, further comprising
a shorting bar disposed substantially parallel to the one of the first testing line and the second testing line on the insulating substrate, wherein the shorting bar is connected to the wire.

11. The display panel of claim 1, further comprising
a pad disposed on the insulating substrate between the wire and the diode unit,
wherein the pad supplies a signal to the wire from an external source.

12. The display panel of claim 1, further comprising
a pad disposed on a side of the insulating substrate opposite to a side thereof on which the diode unit is disposed, wherein the pad supplies a signal to the wire from an external source.

* * * * *